United States Patent
Ormson et al.

(10) Patent No.: US 6,870,428 B2
(45) Date of Patent: Mar. 22, 2005

(54) MOBILE RADIO COMMUNICATIONS DEVICE HAVING A PLL THAT PHASE LOCKS WITH TWO CRYSTAL OSCILLATORS

(75) Inventors: Richard Ormson, Berkshire (GB); Nicholas Craig Bowdler, Berkshire (GB); Anthony Paul Banks, Berkshire (GB); Martin Hennelly, Berkshire (GB)

(73) Assignee: NEC Corporation (JP)

( * ) Notice: Subject to any disclaimer, the term of this patent is extended or adjusted under 35 U.S.C. 154(b) by 47 days.

(21) Appl. No.: 10/411,618

(22) Filed: Apr. 10, 2003

(65) Prior Publication Data

US 2003/0231066 A1 Dec. 18, 2003

(30) Foreign Application Priority Data

Apr. 12, 2002 (GB) .............................. 0208489

(51) Int. Cl.⁷ ............................................... H03B 1/00
(52) U.S. Cl. ................. 331/2; 331/46; 331/47
(58) Field of Search .............................. 331/2, 46, 47, 331/16–18, 158, 162, 29; 327/147–150

(56) References Cited

U.S. PATENT DOCUMENTS

| 5,329,251 | A | | 7/1994 | Llewellyn | 331/2 |
|---|---|---|---|---|---|
| 5,442,460 | A | * | 8/1995 | Rhodes | 348/441 |
| 6,215,835 | B1 | | 4/2001 | Kyles | 375/376 |
| 6,404,288 | B1 | * | 6/2002 | Bletz et al. | 331/2 |
| 6,462,705 | B1 | * | 10/2002 | McEwan | 342/175 |

FOREIGN PATENT DOCUMENTS

| EP | 0098571 | 1/1984 |
|---|---|---|
| JP | 4-192791 | 7/1992 |

OTHER PUBLICATIONS

Search Report, GB0208489-5, Ruth Atkinson, Oct. 31, 2002.

* cited by examiner

*Primary Examiner*—Robert Pascal
*Assistant Examiner*—Joseph Chang
(74) *Attorney, Agent, or Firm*—Ostrolenk, Faber, Gerb & Soffen, LLP

(57) ABSTRACT

A mobile radio communications device has a first crystal oscillator for providing a first master clock frequency for the timebase of a first communications system, a second crystal oscillator for providing a second master clock frequency for the timebase of a second communications system, and a phase locked loop connected between the first and second crystal oscillators and arranged to lock the first and second crystal oscillators together so that the two timebases cannot drift.

9 Claims, 1 Drawing Sheet

MOBILE RADIO COMMUNICATIONS DEVICE HAVING A PLL THAT PHASE LOCKS WITH TWO CRYSTAL OSCILLATORS

BACKGROUND OF THE INVENTION

1. Field of the Invention

The present invention relates to a mobile radio communications device, and related method of operation and, in particular, to a mobile phone and related method of operation.

2. Description of the Related Arts

Mobile phones comprise a master clock circuit, i.e., an oscillator, for generating a relatively high frequency clock signal which forms part of the timebase circuitry within the mobile phone. The timebase generated within the mobile phone is intended to be synchronized with a timebase of a base station with which the mobile phone communicates in accordance with a particular communication system such as, for example; the Global System for Mobile Communication (GSM). Such synchronization is usually achieved by use of an automatic frequency control (AFC) mechanism which operates by comparing the frequency of certain signals received from the base station with the frequency of the local clock and then adjusting the local clock, i.e., the oscillator, to remove the observed frequency difference.

A plurality of mobile communication systems available have been developed which require different master clocks and timebases for their operation.

A mobile phone offering access to two or more such systems would therefore be advantageous since the same mobile phone handset could then be used with a selected one of the different communications systems supported. This choice of system for the same mobile phone would therefore lead to a greater geographical coverage for one and the same mobile phone since different communications systems commonly exhibit different geographical boundaries. This geographical limit commonly occurs at international boundaries and also occurs as a consequence of the time taken to achieve full coverage of a new network technology. Such a dual mode mobile phone would therefore be particularly attractive to users who travel overseas and also to the early users of new technology communications systems.

In order to achieve such interoperability between two respective communications systems, a mobile phone will require at least two master clock circuits serving to track the timebases and air interfaces of the respective communications systems. In order to be practically viable, such dual-mode interoperability should allow for ready switching from one communications system to the other and, in particular, allow for the calibrating of the at least two master clock frequencies with respect to each other so as to allow for an accurate and quick transition between the two communications systems.

SUMMARY OF THE INVENTION

The object of the present invention is to provide for a mobile radio communications device, and related method, which allow for interoperability between two communications systems requiring different timebases in a simple, reliable and cost effective manner.

According to the present invention there is provided a mobile radio communications device comprising a first crystal oscillator for providing a first master clock frequency for the timebase of a first communications system, a second crystal oscillator for providing a second master clock frequency for the timebase of a second communications system, and a phase locked loop connected between the first and second crystal oscillators and arranged to lock the first and second crystal oscillators together.

The present invention is advantageous in achieving accurate synchronization through preventing drift between the respective timebases.

In particular the first crystal oscillator can comprise a first voltage-controlled crystal oscillator (VCXO) for providing the first master clock frequency for the timebase of the first communications system, and the second oscillator can comprise a second voltage-controlled crystal oscillator for providing the second master clock frequency for the timebase of the second communications system, and wherein the standard frequency tracking mechanism of the mobile radio communications device provides the voltage control to the first voltage-controlled crystal oscillator while the phase locked loop (PLL) provides the voltage control to the second voltage-controlled crystal oscillator.

Advantageously, since the two master clocks now lock together by means of the phase locked loop, the two clocks cannot drift.

The present invention advantageously employs the phase locked loop circuit in a manner such that the second crystal oscillator serves to provide low phase noise. Low phase noise is required for correct operation of the mobile communications system. Such a feature serves to distinguish the phase locked loop employed within the present invention from a conventional phase locked loop.

Preferably, the mobile radio communications device includes switching means arranged to ensure that only the circuitry corresponding to the communications system currently providing connection to the network can control the clock frequency.

Preferably, the control for such switching means can be provided either from a DSP (digital signal processor) of the device or from the CPU (central processing unit).

In an embodiment in which a DSP is employed for control of the switching means, the DSP in a circuitry corresponding to each communication system is arranged such that a low signal from this DSP to the switch causes the automatic frequency control (AFC) mechanism for the other communications system to connect to the oscillators. Such a feature is particularly advantageous in improving power consumption within the device.

BRIEF DESCRIPTION OF THE DRAWING

The invention is described further hereinafter, by way of example only, with reference to the accompanying drawing, in which.

DETAILED DESCRIPTION OF THE INVENTION

Figure 1:
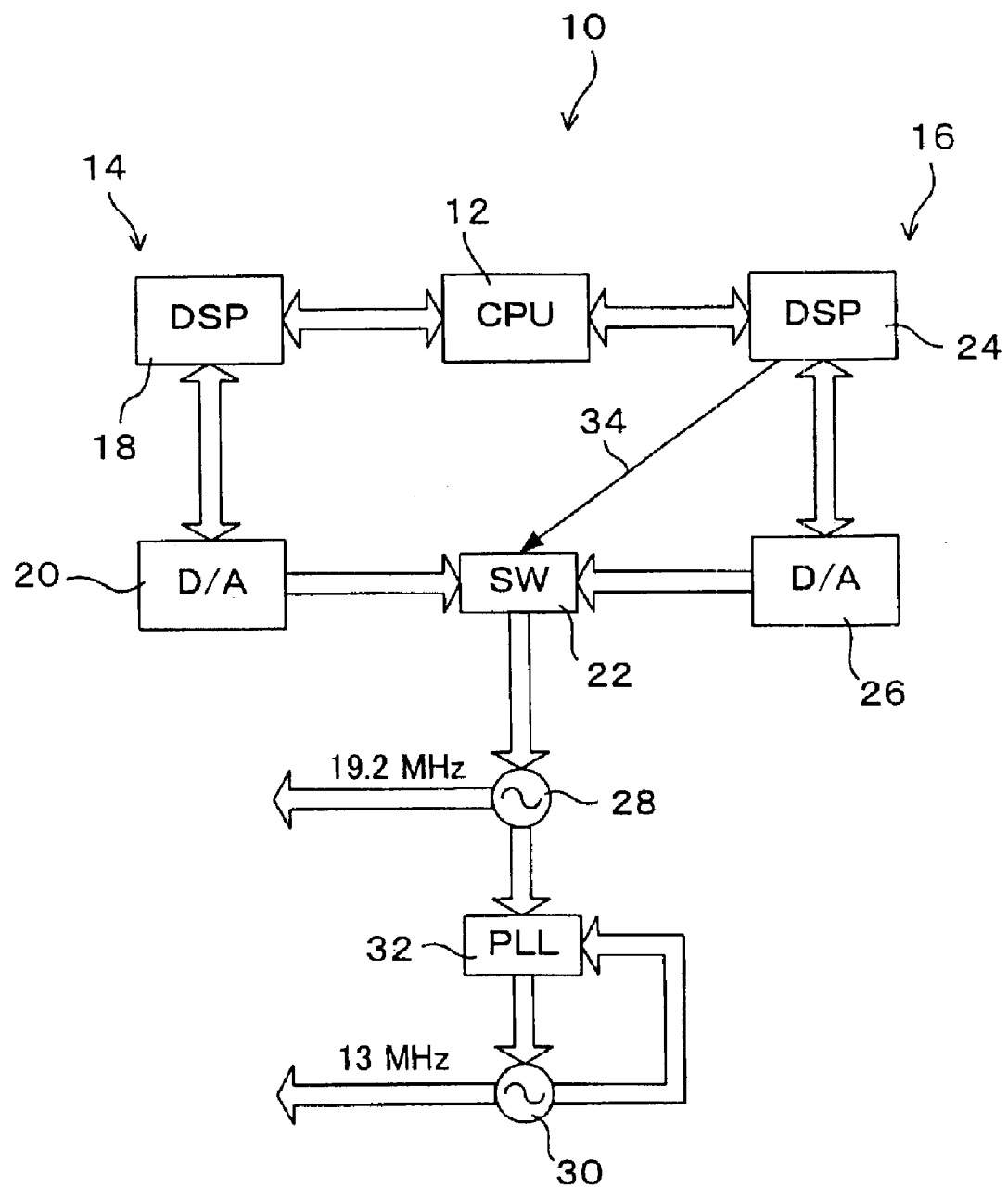
FIG. 1 represents a schematic block diagram of a mobile radio communications device having circuit architecture embodying the present invention.

The circuit arrangement 10 illustrated in FIG. 1 comprises a CPU (central processing unit) 12 for the mobile radio communications device which in this embodiment may comprise a mobile phone handset. The handset is arranged for dual-mode operation and so includes first circuitry 14 arranged for use in synchronizing to a first communications system, for example UMTS (Universal Mobile Telecommunications System), and second circuitry 16 arranged for synchronizing to a second communications system, such as the GSM system. The first circuitry 14 for the UMTS is arranged to receive a control signal from the CPU 12. The first circuitry 14 comprises a DSP (digital signal processor) 18 connected to a digital/analogue converter (D/A) 20 which in turn provides automatic frequency control signals via a switch (SW) 22.

The second circuitry 16 on the GSM side of the handset likewise comprises a DSP 24 connected to a digital/analogue converter 25 arranged for delivering the GSM automatic frequency control signals via the switch 22.

The switch 22 is arranged to allow for one of either of the UMTS automatic frequency control signal from the digital/analogue converter 20, or the GSM automatic frequency control signals from the digital/analogue converter 26 to be delivered to a first of two clock generators, i.e., the oscillators 28, 30, as illustrated in the drawing. Here, each of the oscillators 28, 30 is a voltage-controlled crystal oscillator, and a voltage signal from the switch 22 is applied to the first oscillator 28.

The clock from the first oscillator 28 comprises a 19.2 MHz for use in generating a UTMS timebase clock whereas the clock from the second oscillator 30 comprises a 13 MHz clock for use in generating a GSM timebase.

As illustrated in the drawing, the two oscillators 28, 30 are connected in a series manner by means of a phase locked loop circuit (PLL) 32 which serves to lock the first and second oscillators 28, 30 together. Specially, the oscillation output of the first oscillator 28 and the oscillation output of the second oscillator 30 are supplied to the phase locked loop circuit 32. The phase locked loop circuit 32 supplies a voltage signal to the second oscillator 30 so that both oscillation output are locked to each other.

In contrast to a standard phase locked loop circuit employing a voltage control oscillator (VCO), the phase locked loop circuit 32 within the present invention employs a voltage-controlled crystal oscillator as described above for providing low phase noise.

In the illustrated embodiment, control of the switch 22 is achieved by way of the DSP 18, 24 in such a manner that, for example, as illustrated in the drawing, a low signal via the control line 34 from the DSP 24 is used to control the switch 22 so as to allow the circuitry at the UMTS side of the circuit architecture to connect to the oscillators 28, 30.

This proves to be of assistance in limiting the power consumption within the handset since, otherwise, the DSP in the circuitry corresponding to the communications system not connected to the oscillators 28, 30 would in any case have to be active in order to provide the correct control signal to the switch 22.

As will therefore be appreciated, through the locking of the two clocks by means of a phone locked loop, two timebases can be provided within a single mobile phone handset and which timebases cannot drift.

What is claimed is:

1. A mobile radio communications device comprising:
    a first crystal oscillator for providing a first master clock frequency for timebase of a first communications system;
    a second crystal oscillator for providing a second master clock frequency for timebase of a second communications system; and
    a phase locked loop connected between said first and second crystal oscillators and arranged to lock said first and second crystal oscillators together, wherein said first communications system comprises a UTMS while said second communications system comprises a GSM.

2. The device according to claim 1, further comprising:
    a first circuitry arranged for use in synchronizing the first communications system;
    a second circuitry arranged for use in synchronizing the second communications system; and
    switching means arranged to be controlled such that, between the first and second circuitries, only circuitry providing a current network connection can control the clock frequencies.

3. The device according to claim 2, wherein control for the switching means is provided by way of a digital signal processor.

4. The device according to claim 3, wherein each of said first and second circuitry comprises a digital signal processor, and said digital signal processor is arranged to provide a low signal to the switching means to ensure that the other circuitry connects to the oscillators.

5. The device according to claim 2,
    wherein each of said first and second crystal oscillators comprises a voltage-controlled crystal oscillator,
    wherein each of said first and second circuitries comprises a digital signal processor and a digital/analogue converter to which a digital output of said digital signal processor is delivered, and
    wherein an analogue output from said digital/analogue converter is supplied to said first crystal oscillator via said switching means.

6. The device according to claim 5, wherein control for the switching means is provided by way of said digital signal processor.

7. The device according to claim 1, further comprising switching means arranged to be controlled such that only circuitry providing a current network connection can control the clock frequencies.

8. The device according to claim 7, wherein control for the switching means is provided by way of a digital signal processor.

9. The device according to claim 8, wherein the digital signal processor of each circuitry of each respective timebase is arranged to provide a low signal to the switching means to ensure that the other circuitry connects to the oscillators.

* * * * *